US009490520B2

United States Patent
Morgenstern et al.

(10) Patent No.: US 9,490,520 B2
(45) Date of Patent: Nov. 8, 2016

(54) BROADBAND DIRECTIONAL COUPLER

(71) Applicant: Rohde & Schwarz GmbH & Co. KG, Munich (DE)

(72) Inventors: Michael Morgenstern, Schoeneiche (DE); Dirk Fehse, Berlin (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 310 days.

(21) Appl. No.: 14/345,264

(22) PCT Filed: Mar. 28, 2013

(86) PCT No.: PCT/EP2013/056664
§ 371 (c)(1),
(2) Date: Mar. 17, 2014

(87) PCT Pub. No.: WO2013/149930
PCT Pub. Date: Oct. 10, 2013

(65) Prior Publication Data
US 2014/0292360 A1    Oct. 2, 2014

(30) Foreign Application Priority Data

Apr. 2, 2012    (DE) .................... 10 2012 205 354
Jul. 5, 2012    (DE) .................... 10 2012 211 738

(51) Int. Cl.
*H01P 5/18* (2006.01)
*G01R 21/00* (2006.01)
(Continued)

(52) U.S. Cl.
CPC ................ *H01P 5/18* (2013.01); *G01R 21/00* (2013.01); *H01P 5/183* (2013.01); *G01R 19/0092* (2013.01); *G01R 27/08* (2013.01); *G01R 27/14* (2013.01)

(58) Field of Classification Search
CPC .. G01R 19/0092; G01R 27/14; G01R 27/08; G01R 21/00; H01P 5/18
USPC .......................................... 324/713; 333/112
See application file for complete search history.

(56) References Cited

U.S. PATENT DOCUMENTS

| 3,243,704 A | 3/1966 | Jarger et al. |
| 4,859,971 A | 8/1989 | Edwards et al. |

(Continued)

FOREIGN PATENT DOCUMENTS

| GB | 2328086 A | 2/1999 |
| WO | 2011/076328 A1 | 6/2011 |

OTHER PUBLICATIONS

International Preliminary Report on Patentability and Written Opinion issued in corresponding application No. PCT/EP2013/056664 on Oct. 7, 2014.

(Continued)

*Primary Examiner* — Jermele M Hollington
*Assistant Examiner* — Christopher McAndrew
(74) *Attorney, Agent, or Firm* — Carter, DeLuca, Farrell & Schmidt, LLP (57) ABSTRACT

A broadband directional coupler for measuring a power of a forward or returning high-frequency signal on a coaxial line provides a voltage splitter comprising a first resistor, a second resistor and a third resistor. The first connection of the first resistor is connected to an inner conductor of the coaxial line, the second connection of the first resistor and the first connection of the second resistor are connected to a measuring unit. The first connection of the third resistor is connected to an outer conductor of the coaxial line and to the second connection of the second resistor. The second connection of the third resistor is connected to a ground. The third resistor is annular in shape and arranged concentrically to the inner conductor in a plane orientated orthogonally relative to the inner conductor.

19 Claims, 7 Drawing Sheets

(51) Int. Cl.
*G01R 27/14* (2006.01)
*G01R 27/08* (2006.01)
*G01R 19/00* (2006.01)

(56) References Cited

U.S. PATENT DOCUMENTS

| | | | |
|---|---|---|---|
| 5,382,932 A * | 1/1995 | Monti | H01P 1/205 333/245 |
| 5,926,076 A * | 7/1999 | Johnson | H01P 5/183 333/109 |
| 5,973,568 A * | 10/1999 | Shapiro | H03F 3/602 330/295 |
| 6,066,994 A * | 5/2000 | Shepherd | H01P 5/18 333/109 |
| 2007/0024387 A1 | 2/2007 | Sandacci et al. | |
| 2009/0033436 A1 | 2/2009 | Ahlers | |
| 2012/0262249 A1 | 10/2012 | Morgenstern et al. | |

OTHER PUBLICATIONS

International Search Report issued in corresponding application No. PCT/EP2013/056664 mailed Jul. 12, 2013.

* cited by examiner

BROADBAND DIRECTIONAL COUPLER

The invention relates to a directional coupler for measuring a power of a forward high-frequency signal and/or a returning high-frequency signal on a coaxial line within a broad frequency range, preferably from 9 kHz to 1 GHz.

Directional couplers are used primarily on a high-frequency path between a broadband power amplifier and a complex load, preferably a transmitter antenna, in order to identify an error matching between power amplifier and complex load by measuring the forward high-frequency signal and the returning high-frequency signal, and to switch off the power amplifier rapidly and in a targeted manner if a guide value for the error matching is exceeded.

A directional coupler of this kind is known, for example, from DE 10 2010 009 227 A1. In this context, the directional coupler is structured symmetrically since it splits the coaxial line for the forward high-frequency signal and the returning high-frequency signal at one position in each case, and, in each case, performs a measurement of the inner-conductor voltage and a measurement of the inner-conductor current. In the case of the forward high-frequency signal, the respectively registered voltages for measuring the inner-conductor voltage and the inner-conductor current are superposed additively, whereas, in the case of the returning high-frequency signal, the respectively registered voltages for the inner-conductor voltage and the inner-conductor current are superposed in a subtractive manner. In the event of a matching, the subtraction of the respectively registered voltages for the inner-conductor voltage and the inner-conductor current leads to an ideal value of zero. In the event of an error matching, the voltage difference is not equal to zero. With an infinite VSWR (Voltage Standing Wave Ratio, German: Spannungs-Stehwellenverhältnis), the superposed voltages determined respectively for the forward high-frequency signal and for the returning high-frequency signal are each of equal magnitude.

A directional coupler of this kind is less suitable for a broadband use, since interference voltages, which are phase displaced by comparison with the measured voltages and frequency dependent, are superposed on the individual measured voltages as a result of parasitic, electromagnetic scattering from the coaxial line into the individual measuring units—shunt-resistor for measuring the inner-conductor current, ohmic voltage splitter for measuring the inner-conductor voltage, measurement lines and measurement circuits for the addition or respectively subtraction of the two measured voltages. Accordingly, in each case, for the forward high-frequency signal and the returning high-frequency signal, amplitude and phase responses are obtained which are, on the one hand, dependent upon the frequency and, on the other hand, different from one another. The directional effect over a broad frequency range is therefore not provided with such a directional coupler.

The object of the invention is therefore to provide a directional coupler which provides a good directivity over the broadest possible frequency range.

The object is achieved by a broadband directional coupler according to the invention with the features of claim 1.

Advantageous technical developments of the invention are listed in respectively dependent claims.

The measuring arrangement according to the invention for measuring the inner-conductor current and the inner-conductor voltage from a first resistor, of which the first connection is preferably connected to the inner-conductor of the coaxial line and the second connection is preferably connected to a measuring unit and to a first connection of a second resistor, and to a third resistor, of which the first connection is preferably connected to an outer conductor of the coaxial line and to the second connection of the second resistor, and of which the second connection is preferably connected to a ground, is optimised according to the invention, on the one hand, by embodying the third resistor in an annular shape and, on the other hand, by arranging it concentrically to the inner conductor of the coaxial line in a plane orientated orthogonally relative to the inner conductor.

In view of the embodiment of the third resistor, which represents the shunt resistor for measuring the outer-conductor current and therefore the inner-conductor current, as a single annular resistor, it provides, by comparison with a parallel circuit according to the prior art named above comprising a plurality of individual resistors arranged in a circle, a negligibly small inductive impedance, which is connected in series to the ohmic part of the third resistor. The negligibly small inductive impedance and the concentric arrangement of the third resistor in a plane orientated orthogonally to the inner conductor of the coaxial line prevent an electromagnetic induction of a scattering voltage from the inner conductor of the coaxial line in the annular third resistor. Moreover, the annular embodiment of the third resistor allows a broader and more uniform distribution of the thermal losses along the resistor ring.

If the third resistor is preferably additionally embodied as a low-ohmic resistor, the third resistor, in combination with its negligibly small inductive impedance, prevents any undesirable strong attenuation and phase distortion of the high-frequency signal in the high-frequency path. Accordingly, the broadband directional coupler according to the invention can also be used advantageously in a high-frequency path in which high-frequency signals are transmitted with a high power level.

The third resistor is preferably applied to a first side of a ceramic plate coated with a conductive layer, which is attached in a gap-free manner between two flat-lathed end surfaces of two halves of a housing of the broadband directional coupler arranged in a substantially rotationally symmetrical manner around the inner conductor of the coaxial line. Since the third resistor preferably provides a relatively smaller spatial extension in the axial direction than in the radial direction, the end surface of a housing half facing towards the third resistor in the region of the third resistor need provide only a milled groove of shallow depth for the introduction of the third resistor into it and at the same time for the realisation of a gap-free mechanical contact between one housing half and the ceramic plate in the remaining region of the ceramic plate. The ceramic plate preferably additionally provides a borehole at its centre for a cylindrical, first hollow cavity for guiding the inner conductor of the coaxial line. This borehole is not metallised.

If, preferably firstly, the housing of the broadband directional coupler is manufactured from an electrically conductive material, for example, aluminium; if, preferably secondly, a high-permeability annular core is inserted into a second hollow cavity, which is arranged concentrically and at a given spacing distance from the first hollow cavity in a housing half facing towards the third resistor; and if, preferably thirdly, the ohmic part of the third resistor is significantly smaller than the resistor of the housing (with annular core); and if, preferably fourthly, the ceramic plate provides an electrical connection between the two housing halves in the region outside the annular third resistor, then, a majority of the outer-conductor current of the coaxial line flows to the inside of the housing, that is, in the region between the first and the second hollow cavity, via the third resistor applied to the ceramic plate, through the electrical connection to the housing half of the broadband directional coupler which faces away from the third resistor, and finally to the inside of the housing half facing away from the third resistor.

The preferred use of aluminium as the conductive material for the housing of the broadband directional coupler additionally achieves an optimal heat removal with low weight in the case of coaxial-conductor currents in the relatively high power range.

The high-permeability annular core, preferably inserted in the second hollow cavity, of which the mean diameter is smaller than the mean diameter of the annular third resistor, forces a majority of the outer-conductor current of the coaxial line to flow to the inside of the housing in the region between the first and second hollow cavity.

A direct mechanical and electrical contact between the two housing halves and the ceramic plate is provided by the preferred gap-free attachment of the ceramic plate between the two halves of the housing. A direct electrical contact between the housing half of the broadband directional coupler in which the high-permeability annular core is arranged and the first side of the ceramic plate, and therefore the third resistor applied to the first side, is additionally provided as a result of the application of a conductive layer on the side of the ceramic plate to which the third resistor is applied—referred to below as the first side of the ceramic plate.

The electrical connection in the ceramic plate between the two adjacent halves of the housing is realised in a preferred manner via a plurality of through-contacts which can be arranged in a specified angular grid in a circle concentric with the annular third resistor and disposed outside the annular third resistor.

The voltage at the third resistor, which corresponds to the outer-conductor current and therefore to the inner conductor current of the coaxial line, is preferably guided via a wire which is contacted to the conductive layer on the ceramic plate within the annular third resistor to the second connection of the second resistor of the measuring arrangement. In order to prevent any undesired electromagnetic scattering from the inner conductor of the coaxial line to the wire connection and accordingly any undesired, additionally superposed interference voltage, the wire is guided to the second connection of the second resistor in a channel of the housing free from electromagnetic fields.

The first resistor of which the first connection is connected to the inner conductor of the coaxial line, is preferably disposed in a third hollow cavity of the housing of the broadband directional coupler, which provides only a slot to the first hollow cavity for the through passage of the connection between the inner conductor of the coaxial line and the first connection of the first resistor. This guarantees that the first resistor is disposed in a hollow cavity free from the electrical field of the inner conductor, and no undesired interference voltages are generated between the first resistor and the housing.

The first resistor is preferably realised as a resistor layer which is printed onto a ceramic substrate. The first resistor is preferably disposed in the region of its first and second connections on a large-area counter bearing associated with the third hollow cavity and made, for example, of aluminium. In this manner, an optimal heat removal from the first resistor is possible. The first resistor is exposed above and below its resistor layer, so that, at the same time, an optimal electrical insulation and an optimal thermal radiation to the housing of the broadband directional coupler are realised, and parasitic capacitances with reference to the housing are minimised.

The measuring unit for determining the power of a forward high-frequency signal or a returning high-frequency signal is preferably housed on the printed circuit in a field-free, fourth hollow cavity of the housing or in an additional housing shielded from electromagnetic fields and connected directly to the housing of the broadband directional coupler.

The measuring unit for determining the power of a forward high-frequency signal is preferably galvanically separated from the measuring unit for determining the power of a returning high-frequency signal. In this manner, a mutual, galvanic cross-coupling of the measured signals is avoided.

Finally, the end surfaces of mutually opposing housing halves preferably each provide an annular, ring-shaped groove of which the diameter is slightly smaller than the external diameter of the substantially rotationally symmetrical housing of the broadband directional coupler and into which special springs for the electromagnetic shielding of the measuring arrangement of the broadband directional coupler from electromagnetic scattering from the outside are inserted.

Exemplary embodiments of the broadband directional coupler according to the invention are explained in greater detail below by way of example with reference to the drawings. The figures of the drawings show.

Before the broadband directional coupler according to the invention is presented in detail, the schematic measuring arrangement with the broadband directional coupler according to the invention, which is essential for an understanding of the broadband directional coupler according to the invention, will be explained with reference to FIG. 1.

Figure 1:
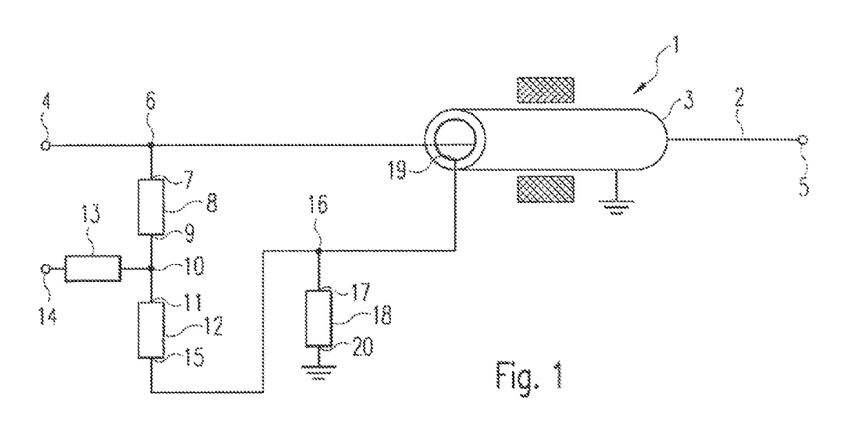
FIG. 1 a circuit diagram with the broadband directional coupler according to the invention.

FIG. 1 shows the measuring arrangement for measuring the voltage and current on an inner conductor of the coaxial line, which is identical for the measurement of a forward high-frequency signal and a returning high-frequency signal. The coaxial line 1 comprises an inner conductor 2 and an outer conductor 3 concentric with the inner conductor 2. The external side of the outer conductor 3 is connected at one end to the ground potential, as indicated in FIG. 1. The inner conductor 2 is typically connected at its input-end connection 4 to a broadband power amplifier not illustrated in FIG. 1, and, at its output-end connection 5 to a complex load, typically a transmission antenna, which is not illustrated in FIG. 1.

At the input end, the inner conductor 2 is connected, for the measurement of the voltage of the inner conductor 2 at a node 6, to the first connection 7 of a first resistor 8 associated with a voltage splitter, which is embodied to be comparatively high-ohmic in order to achieve a high splitting factor between the voltage to be measured at the inner conductor 2 and a measurement voltage to be processed by a measuring unit, which will be explained later. For a voltage difference between a voltage to be measured in the inner conductor and a measurement voltage to be processed in the measuring unit at the level of 1000:1, and for a broadband directional coupler embodied in the kilowatt range, a resistance value of 50 kΩ is typically recommended for the first resistor 8, which must also be embodied to be high-voltage-secure to ensure an inner-conductor voltage of approximately 1200 V effective.

The second connection 9 of the first resistor 8 is connected via a node 10 with one end to the first connection 11 of a second resistor 12 associated with the voltage splitters and with the other end via an appropriately dimensioned decoupling resistor 13 to the decoupling connection 14, which is connected to the measuring unit still to be explained. The second connection 15 of the second resistor 12 is connected via a further node 16 to the first connection 17 of a third resistor 18, which, as a shunt measuring resistor, measures the outer-conductor current of the coaxial line 1 which is approximately identical to the inner-conductor current, and, at the other end, to the internal side 19 of the outer conductor 3 of the coaxial line 1. The second connection 20 of the third resistor 18 is guided to ground. Additional parasitic capacitances, such as are found in a measuring arrangement of this kind and described in DE 10 2010 009 227 A1, are not illustrated in FIG. 1 for the sake of simplicity.

In order to prevent interference voltages generated in an inductive and capacitive manner in the measuring arrangement and therefore to achieve a more accurate measured result, the constructive embodiments required for this purpose are presented below, especially for the third resistor 18 acting as a shunt-current measuring resistor and the first resistor 8 positioned at the high-voltage end of the voltage splitter and acting as a voltage measuring resistor. The second resistor 12 positioned at the low voltage end of the voltage splitter and the decoupling resistor 13 are disposed within a measuring unit still to be discussed, which is provided with appropriate electromagnetic shielding measures, and need not therefore be explained through a separate constructive embodiment.

Initially, the constructive embodiment of the third resistor 18 which supplies a voltage proportional to the current in the coaxial line will be described with reference to FIGS. 2A, 2B, 3, 6, 8 and 9.

As shown in FIG. 1, the third resistor 18 is connected with its first connection 17 to the internal side 19 of the outer conductor 3 of the coaxial line 1, on which the returning voltage identical to the inner conductor current of the coaxial line 1 flows, and connected galvanically with its second connection 20 to ground. In order to register the inner-conductor current of the coaxial line 1, the coaxial line 1 is separated in the region of the broadband directional coupler, and the outer conductor 3 of the coaxial line 1 is replaced by a housing 21, which, on the one hand, provides a good electrical conductivity for guiding the outer-conductor current and, on the other hand, provides a good thermal conductivity for removing the heat occurring respectively in the individual resistors, and is preferably therefore made of aluminium. The housing 21, like the outer conductor 3 of the coaxial line 1 provides a rotationally symmetrical shape.

Figure 2A:
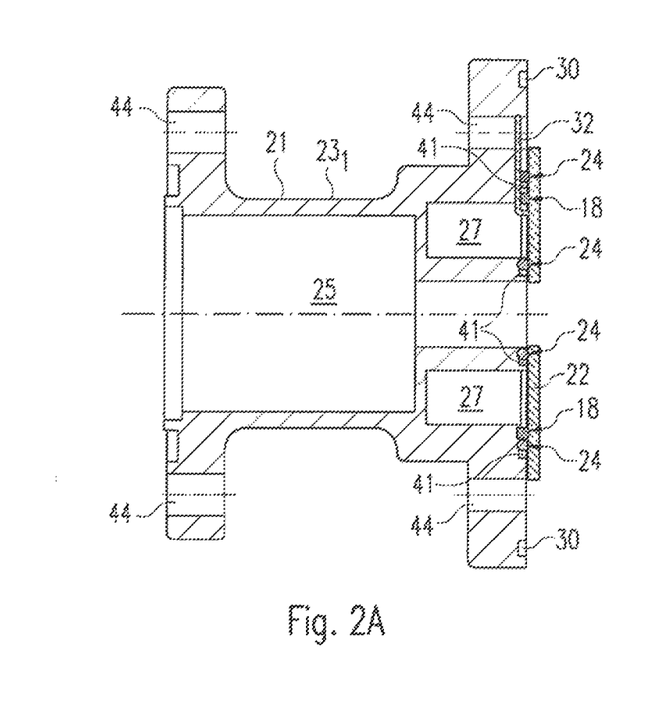
FIG. 2A a cross-sectional view and a plan view of the first housing half of a broadband directional coupler according to the invention with integrated shunt measuring resistor.
Figure 2B:
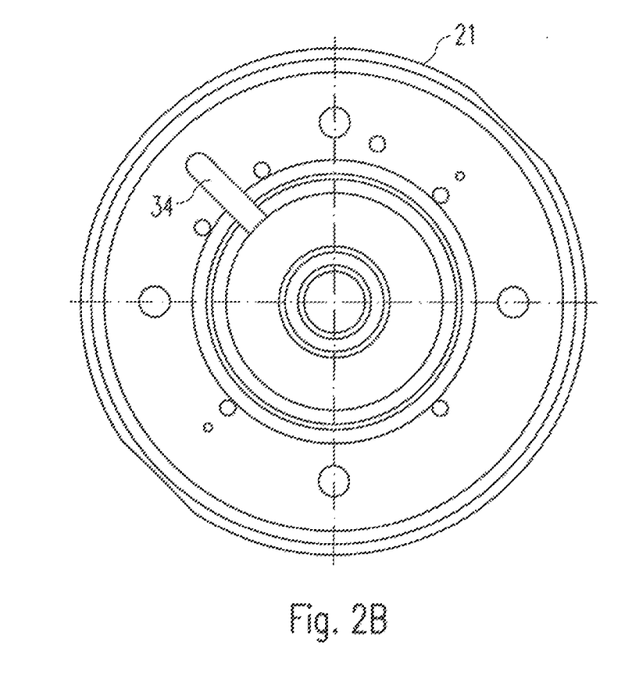
FIG. 2B a cross-sectional view and a plan view of a second housing half of a broadband directional coupler according to the invention with integrated shunt measuring resistor.
Figure 3:
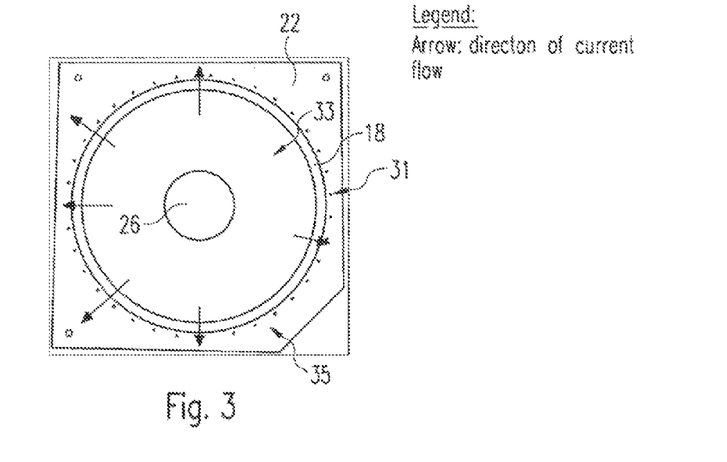
FIG. 3 a plan view of a ceramic plate with integrated shunt measuring resistor.

For the measurement of the inner-conductor current of the forward high-frequency signal and the inner-conductor current of the returning high-frequency signal, the housing 21 is interrupted in each case by a ceramic plate 22 preferably made from aluminium nitride with a comparatively high thermal conductivity of 180-190 W/m²K and a dielectric coefficient $\in_r$ of 9.5 with a third resistor 18 of preferably 47 mΩ applied to the first side of the ceramic plate 22, which is fixed rigidly and in a gap-free manner in each case between two halves $23_1$ and $23_2$ and respectively $23_2$ and $23_3$ of the housing 21.

In order to realise a gap-free fixing of the ceramic plate 22, which is as flat as possible on both sides, in each case within two halves $23_1$ and $23_2$ and respectively $23_2$ and $23_3$ of the housing 21, the end surface of the individual halves $23_1$ and $23_2$ and respectively $23_2$ and $23_3$ of the housing 21 are lathed flat. To reduce or completely eliminate the effect of any irregularities occurring on the flat surfaces of the ceramic plate 22 and on the end surfaces of the housing halves $23_1$ and $23_2$ and respectively $23_2$ and $23_3$ on the free play between the respective ceramic plate 22 and the associated housing halves $23_1$ and $23_2$ and respectively $23_2$ and $23_3$, annular countersunk grooves 41 arranged concentrically to the inner conductor 2 of the coaxial line 1, in which contact springs 24 are introduced in each case in an end surface of a housing half $23_1$ or respectively $23_3$ disposed opposite to the first side of the respective ceramic plate 22 for the mechanical contact between the housing halves $23_1$ or respectively $23_3$ and the respective ceramic plate 22. The housing halves $23_1$ and $23_2$ or respectively $23_2$ and $23_3$ each disposed opposite are connected to one another respectively via screws 43 which are guided in axially orientated boreholes 44 in the end surfaces of the housing halves $23_1$ and $23_2$ and respectively $23_2$ and $23_3$. The housing halves $23_1$ and $23_2$ and $23_3$ facing respectively towards the coaxial lines 1 are also attached to the coaxial lines 1 via screws 43 guided in axially orientated boreholes 44 of the housing halves $23_1$ and $23_3$.

In order additionally to achieve an electrical contact between the housing halves $23_1$ and respectively $23_3$ and the first side of the respective ceramic plate 22, the ceramic plate 22 is coated on its first side with a conductive layer, preferably with silver palladium, on the inside and on the outside of the third resistor 18 embodied in an annular shape.

The housing halves $23_1$, $23_2$ and $23_3$ embodied in a rotationally symmetrical manner each provide an axial, internal borehole acting as the first hollow cavity 25, in which the inner conductor 2 of the coaxial line 1 is guided in each case. In this context, the inner conductor 2 is supported via a support plate 42 against the internal side of the housing 21. The first hollow cavity 25 in the housing halves $23_1$ and $23_3$ facing respectively towards the first side of the individual ceramic plates 22 is embodied in a stepped manner, whereas the internal diameter of the first hollow cavity 25 in the region of the ceramic plate 22 is embodied smaller than the internal diameter of the first hollow cavity 25 in the region of the connection of the coaxial line 1 and corresponds to the internal diameter of an internal borehole 26 provided in the ceramic plate 22.

A second hollow cavity 27 arranged concentrically relative to the first hollow cavity 25 and embodied in an annular shape, which is disposed in direct contact with the respective ceramic plate 22 and in which an annular core 28 with a high permeability, preferably a nano-crystalline annular core with an inductance of 120 μH, is inserted, is provided in the region of the smaller internal diameter of the first hollow cavity 25 introduced respectively in the housing halves 23$_1$ and 23$_3$ at a given spacing distance relative to the first hollow cavity 25.

In each case, two adjoining housing halves 23$_1$ and 23$_2$ and respectively 23$_2$ and 23$_3$ are connected to one another in an electrically conductive manner in the region of the respective ceramic plate 22 via several special springs 29, which are introduced into annular, milled grooves 30 in the end surfaces of the respective housing halves 23$_1$ and 23$_2$ and respectively 23$_2$ and 23$_3$. The diameter of the annular, milled grooves 30 is embodied slightly smaller than the largest radial extension of the rotationally symmetrical housing 21 and acts, on the one hand, as an electromagnetic shielding of the coaxial line 1 and of the entire broadband directional coupler according to the invention from external electromagnetic fields and, on the other hand, to guide sheath waves which flow on the external side of the outer conductor 3 of the coaxial line 1.

The first side of a ceramic plate 22 is electrically connected via several through-contacts 31 to the opposite, second side of the ceramic plate 22. The through-contacts 31 are arranged around the circle with a given angular grid corresponding to the number of through-contacts in a circle, of which the diameter is larger than the external diameter of the annular third resistor 18. The internal diameter of the annular third resistor 18 is larger than the external diameter of the annular core 28, while the external diameter of the annular third resistor 18 is embodied to be smaller than the diameter of the circle of perforations of the through-contacts.

The voltage potential connected at the node 16 is picked up at the electrically conductive layer on the surface 33 of the first side of the ceramic plate 22 disposed on the inside with reference to the annular third resistor 18 via a soldered connection to a wire 32 and supplied to the second connection 15 of the second resistor 12, which is disposed in a measuring unit still to be described. In order to prevent electromagnetic scattering on the wire 32 and accordingly to prevent an interference voltage superposed on the voltage potential measured at the node 16, the wire 32 is guided within the housing 21 in a recess 34 free from electromagnetic fields, preferably in a milled channel free from electromagnetic fields.

The measurement of the inner-conductor current of the coaxial line 1 which is based on a measurement of the outer-conductor current of the coaxial line 1 corresponding to the inner-conductor current, is explained below with reference to FIGS. 3, 8 and 9. In FIG. 9, the measuring unit 39 and the measuring arrangement for measuring the voltage at the inner conductor of the coaxial line have not been illustrated for the sake of simplicity.

Figure 8:
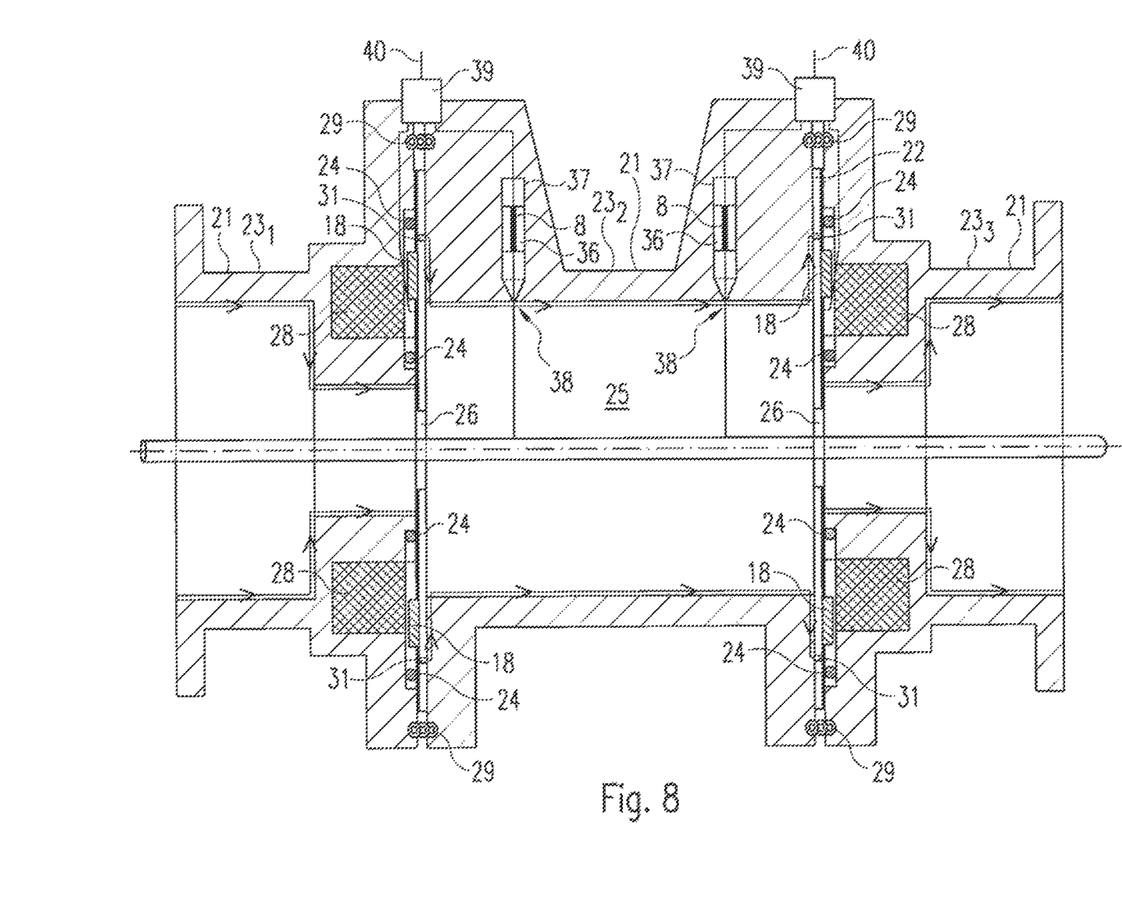
FIG. 8 a schematic view of the course of the outer-conductor current in a broadband directional coupler according to the invention.
Figure 9:
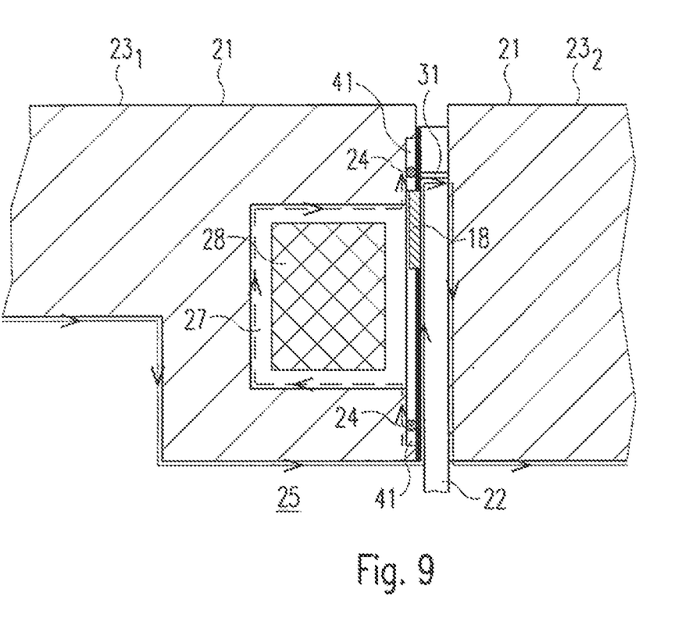
FIG. 9 a schematic view of the courses of all of the currents occurring in a broadband directional coupler according to the invention.

The outer-conductor current of the coaxial line 1, which flows along the internal side of the housing half 23$_1$ of the housing 21 because of the skin-effect (see the course of the outer-conductor current in FIGS. 8 and 9 provided with arrows and comprising a continuous line), meets the electrically conductive coating on the surface 33 of the first side of the ceramic plate 22 disposed on the inside with reference to the annular third resistor 18. Since the impedance of the annular third resistor 18 is smaller by a multiple than the impedance of the housing 21 (with annular core 28 arranged in the hollow cavity 17), the outer-conductor current will not continue to flow on the internal side of the housing 21 in the region of the first hollow cavity 25 to the next housing half 23$_2$, but via the conductive coating on the surface 23 of the first side of the ceramic plate 22 disposed on the inside, the annular third resistor 18, the conductive coating on the surface 35 of the first side of the ceramic plate 22 disposed on the outside with reference to the annular third resistor 18, the through-contacts 31 between the first and the second side of the ceramic plate 22 and via the second side of the ceramic plate 22 back to the internal side of the housing half 23$_2$ of the housing 21 in the region of the first hollow cavity 25.

Additionally, a very small parasitic outer-conductor current—illustrated in FIG. 9 by a dotted line course provided with arrows—flows from the internal side of the housing half 23$_1$ of the housing 21, along the end surface of the housing half 23$_1$ of the housing 21 to the second hollow cavity 27, along the internal surfaces of the second hollow cavity 27, the countersunk groove 41 introduced into the end surface of the housing half 23$_1$ of the housing 21, via the contact springs 24 disposed in the countersunk groove 41, via the through-contacts 31 between the first and second side of the ceramic plate 22 and via the second side of the ceramic plate 22 back to the internal side of the housing half 23$_2$ of the housing 21 in the region of the first hollow cavity 25.

In view of the effect of the annular core 28 with its high permeability coefficient, a majority of the outer-conductor current flowing on the internal side of the housing half 23$_1$ of the housing 21 is guided via the electrical coating of the ceramic plate 23 and the annular third resistor 18 applied as a coating resistor to the ceramic plate 33, and only a small portion of the outer-conductor current is guided past the exposed, internal surfaces of the housing half 23$_1$ of the housing 21 on the annular third resistor 18 as a parasitic outer-conductor current.

The potential guided via the wire 32 to a measuring unit on the coated surface 33 of the first side of the ceramic plate 22 positioned on the inside with reference to the annular third resistor 18 corresponds to the positive voltage drop of the outer-conductor current at the third resistor 18 with reference to the external side of the housing 21 disposed at ground potential and serves for the measurement of the forward high-frequency signal.

As shown in FIG. 8, the outer-conductor current flows from the internal side of the housing half 23$_2$ of the housing 21 via the second side of the further ceramic plate 22 disposed between the two housing halves 23$_2$ and 23$_3$, the through-contacts 31 of this ceramic plate 22, the surface 35 of the first side of the ceramic plate 22 positioned on the outside with reference to the annular third resistor 18, the annular third resistor 18 applied to the ceramic plate 23 as a layer resistor and the surface 35 of the first side of the ceramic plate 22 positioned on the inside with reference to the annular third resistor 18 to the internal side of the housing half 23$_3$ of the housing 21.

The potential drawn via a wire 32 to the measuring unit on the coated surface 33 of the first side of the ceramic plate 22 disposed between the two housing halves 23$_2$ and 23$_3$ positioned towards the inside with reference to the annular third resistor 18 accordingly corresponds to the negative voltage drop of the outer-conductor current at the third resistor 18 with reference to the external side of the housing 21 disposed at ground potential and is used for the measurement of the returning high-frequency signal.

Figure 4:
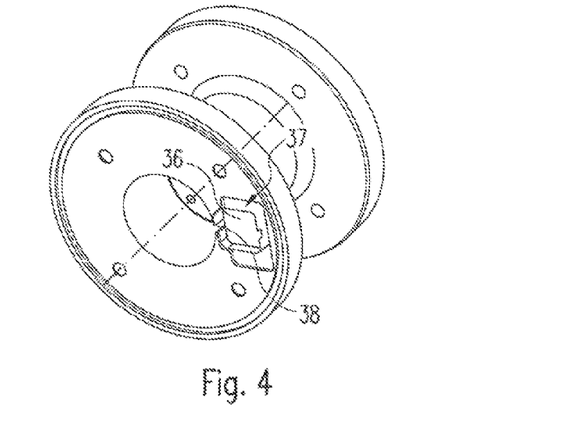
FIG. 4 a three-dimensional view of a housing half of an exemplary embodiment of the broadband directional coupler with integrated voltage measuring resistor.
Figure 5:
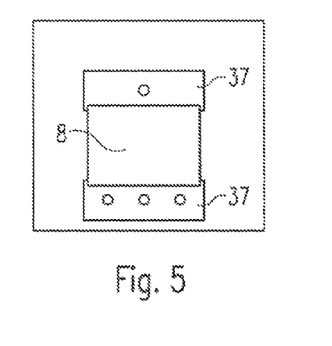
FIG. 5 a plan view of a voltage measuring resistor.
Figure 6:
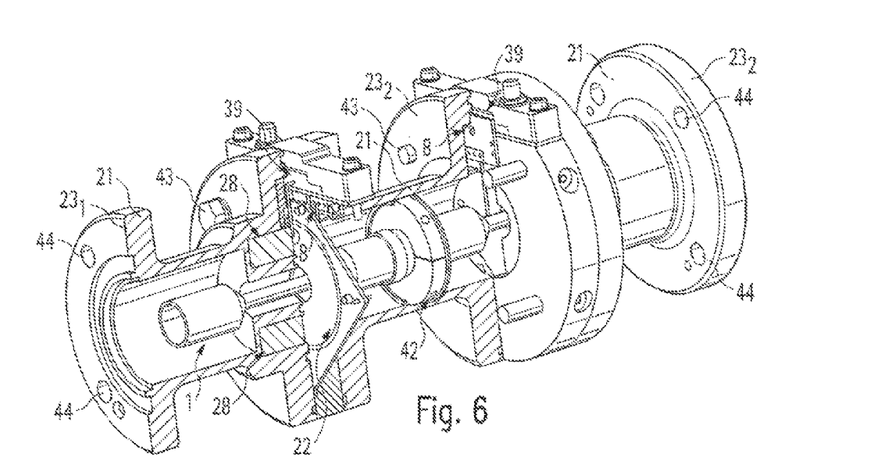
FIG. 6 a three-dimensional view of an exemplary embodiment of the broadband directional coupler.

In the following section, the constructive embodiment of the first resistor 8, which registers the voltage at the internal conductor 2 of the coaxial line 1 and splits it to a relatively lower measurement voltage, is described with reference to FIGS. 4, 5 and 8.

As illustrated in FIG. 1, the first resistor 8 for the voltage splitting of the voltage of the inner conductor 2 of the coaxial line 1 to an appropriate voltage level for the measuring unit 39 is connected by its first connection 7 to the inner conductor 2 of the coaxial line 1 and by a second connection 9 to the node 10. The first resistor 8 is realised as a resistor layer on a special ceramic substrate, preferably made of aluminium oxide ($Al_2O_3$)—for example with a thermal conductivity of 26 $W/m^2K$ and a dielectric coefficient $\in_r$ of 9.0. The first resistor 8 is designed for voltages up to a maximum of 1200 V effective and powers up to 8000 W and typically provides 50 kΩ.

The first resistor 8 is housed, as shown in FIG. 8, in a third hollow cavity 36 within the housing 21, preferably within the housing half $23_2$. The resistor layer of the first resistor 8 is exposed above and below with reference to the internal walls of the third hollow cavity 36. As shown in FIG. 5, the first resistor 8 is mounted in the region outside its first and second connection 7 and 9, in each case in a counter bearing 37. Because of the sometimes very high thermal stresses on the resistor 8, these counter bearings (support surfaces) 37 are manufactured from a material with a high thermal conductivity, preferably aluminium, in order to remove the heat generated in the resistor layer of the first resistor 8 in an optimal manner. With a power of 8000 W to be transmitted on the coaxial line 1 and a standing wave ratio of 10, approximately 25 W of heat must be removed from the first resistor 8. The first resistor 8 disposed centrally in the third hollow cavity 36 is separated from the first hollow cavity 25 only by a slot 38 as shown in FIGS. 4 and 8. The physical extension of the slot 38 corresponds to the cross-section of the connecting line between the inner conductor 2 of the coaxial line 1 disposed in the first hollow cavity 25 and the first resistor 8. Accordingly, the build-up of a capacitive interference-voltage between the resistor layer of the first resistor 8 and the internal walls of the third hollow cavity 36, starting from the power line of the broadband directional coupler, that is, from the inner-conductor 2 of the coaxial line 1, which is undesirably superposed over the voltage drop at the first resistor 8, is prevented.

Figure 7A:
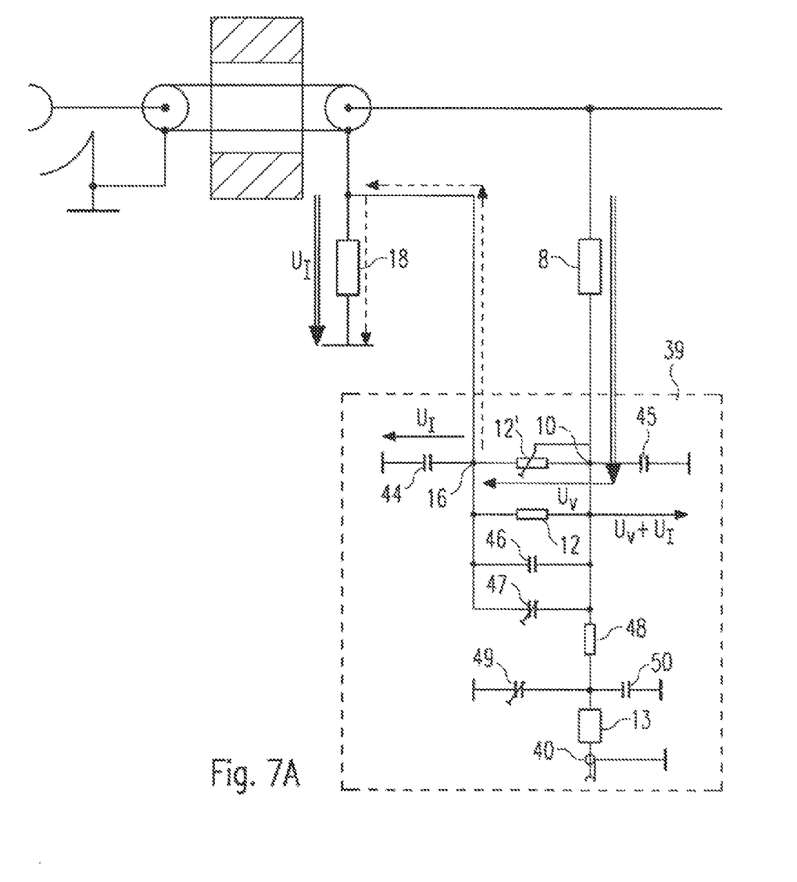
FIG. 7A a circuit diagram of a measuring unit for registering a forward high-frequency signal.
Figure 7B:
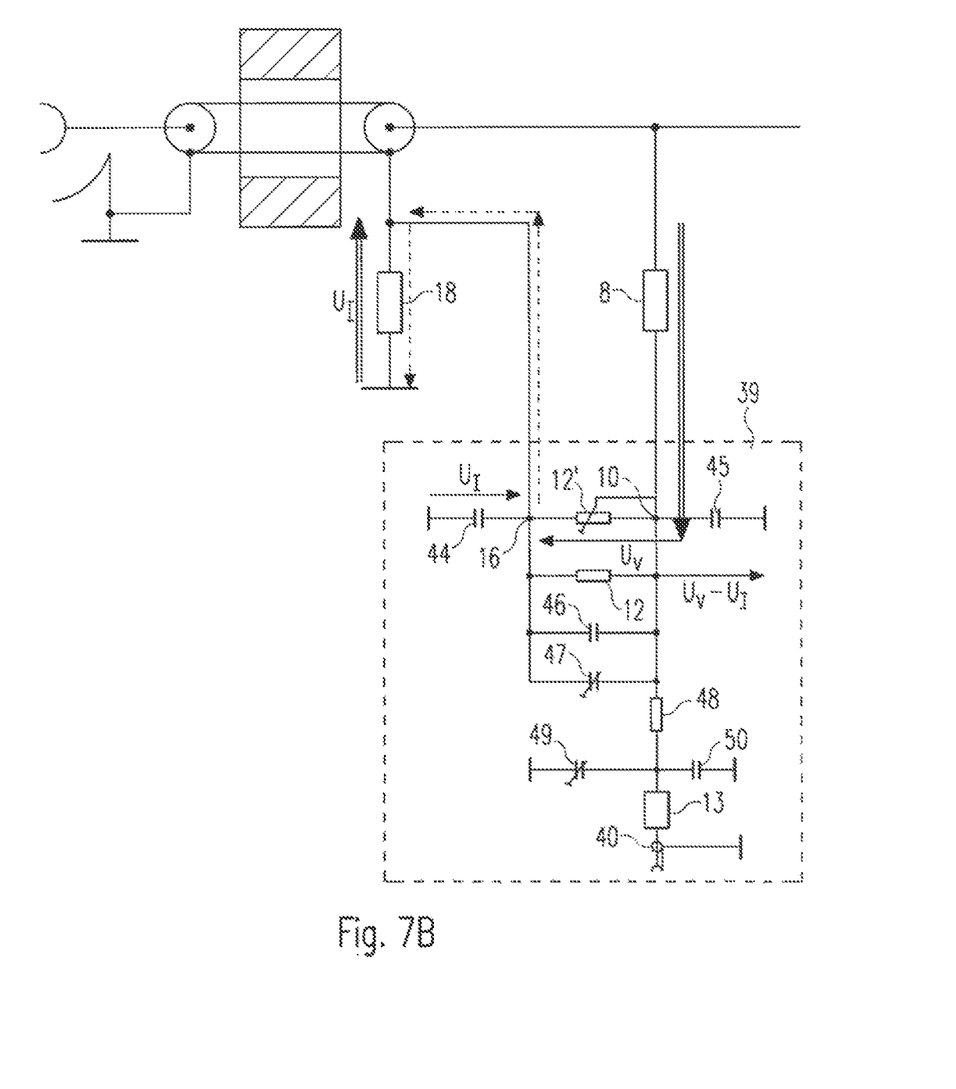
FIG. 7B a circuit diagram of a measuring unit for registering a returning high-frequency signal.

The measured voltage picked up in the third resistor 18 at the node 16 and rerouted via the wire 32 which is proportional to the outer-conductor current of the coaxial line 1, and the measured voltage picked up at the node 10 which represents the voltage registered and split in the inner conductor 2 of the coaxial line 1 through the first resistor 8, are supplied for the measurement of the forward high-frequency signal and the returning high-frequency signal, in each case to a measuring unit 39, as shown in FIGS. 7A and 8 in the case of the measurement of the forward high-frequency signal, and as shown in FIGS. 7B and 8 in the case of the measurement of the returning high-frequency signal.

The measured voltages registered at the two contacts 10 and 16 respectively are supplied within the measuring unit 39 to the first connection 11 and to the second connection 15 of the second resistor 12. The second resistor 12 in the view shown in FIGS. 7A and 7B is realised through a parallel connection of a fixed-value resistor 12 and a trimmable resistor 12'. The operating point of the measured voltage at the contact 10 can be adjusted with the trimmable resistor 12' of the second resistor 12. They are used primarily for balancing voltage errors caused by tolerances of the two ceramic resistors 16 and 8.

As shown in FIGS. 7A and 7B, the voltage $U_I$ declining at the third resistor 18, which is proportional to the outer-conductor current and therefore to the inner-conductor current of the coaxial line 1, is disposed at the capacitor 44, which is connected between the node 16 and ground. The declining voltage $U_V$, which is disposed at the second resistor 12 and which is proportional to the voltage on the inner conductor 2 of the coaxial line 1, is connected between the nodes 10 and 16. Accordingly, for the measurement of the forward high-frequency signal according to FIG. 7A and equation (1), the sum $U_V+U_I$ of the voltage $U_V$ declining at the second resistor 12 and the voltage $U_I$ declining at the third resistor 18 is disposed at the capacitor 45 which is connected between the node 10 and ground. For the measurement of the returning high-frequency signal according to FIG. 7B and equation (2), the difference $U_V-U_I$ between the voltage $U_V$ declining at the second resistor 12 and the voltage $U_I$ declining at the third resistor 18 is disposed at the capacitor 45.

$$U_V + U_I = k \cdot \sqrt{P_{Eff}} \cdot \left( \sqrt{VSWR} + \frac{1}{\sqrt{VSWR}} \right) \quad (1)$$

$$U_V - U_I = k \cdot \sqrt{P_{Eff}} \cdot \left( \sqrt{VSWR} - \frac{1}{\sqrt{VSWR}} \right) \quad (2)$$

In equation (1) and (2), the variable $P_{Eff}$ represents the effective power transmitted by the broadband directional coupler according to the invention, the variable PST/PR represents the voltage standing wave ratio of the coaxial line 1 and the variable k represents a proportionality factor.

The voltage sum or the voltage difference according to equations (1) and (2) respectively does not include the parasitic voltage drop at the third resistor 18 from the inner conductor 2 of the coaxial line 1 illustrated with the dotted line in FIGS. 7A and 7B since it is negligibly small.

The voltage sum or the voltage difference declining at the capacitor 45 is supplied to a filter circuit connected in parallel to the second resistor 12 in order to achieve a frequency compensation. This filter circuit is realised as a π-circuit and comprises the parallel connection of the capacitor 46 with a fixed capacitance and of the capacitor 47 adjustable with regard to its capacitance, the resistor 48 and the parallel connection of the capacitor 50 with a fixed capacitance and of the capacitor 49 adjustable with regard to its capacitance. The filter circuit is connected via the decoupling resistor 13 to the output 40 of the filter circuit and therefore to the measuring unit 39. A measured voltage proportional to the forward high-frequency signal or the returning high-frequency signal can be picked up at the output 40 realised as a coaxial line connection, typically as an SMP or SMA connection.

The broadband directional coupler according to the invention is not restricted to the illustrated embodiment. The invention also covers all combinations of all of the features claimed in each of the claims, all of the features disclosed in each case in the description and all of the features illustrated in the figures of the drawings.

The invention claimed is:
1. A broadband directional coupler for measuring a power of a forward or returning high-frequency signal on a coaxial line, comprising:
   a voltage splitter including a first resistor and a second resistor, wherein a first connection of the first resistor is connected to an inner conductor of the coaxial line; and
   a third resistor, wherein the third resistor is annular in shape and arranged concentrically to the inner conductor in a plane arranged with an orthogonal orientation relative to the inner conductor, wherein the third resistor is applied to a first side of a ceramic plate coated with a conductive layer, which is attached in a gap-free manner between two lathed, flat end surfaces of two halves of a housing of the broadband directional coupler arranged with substantial rotational symmetry around the inner conductor, and of which a centre provides a borehole for a cylindrical, first hollow cavity for guiding the inner conductor, and wherein the ceramic plate is made from aluminium nitride.

2. The broadband directional coupler according to claim 1, wherein a second connection of the first resistor and a first connection of the second resistor is connected to a measuring unit, and/or wherein a first connection of the third resistor is connected to an outer conductor of the coaxial line and to the second connection of the second resistor, and a second connection of the third resistor is connected to a ground.

3. The broadband directional coupler according to claim 1, wherein the third resistor provides a spatial extension in an axial direction smaller than a spatial extension in a radial direction.

4. The broadband directional coupler according to claim 1, wherein the housing is manufactured from an electrically conductive material with a conductivity lower than a conductivity of the third resistor.

5. The broadband directional coupler according to claim 1, wherein an annular core is disposed in a second hollow cavity, which is arranged concentrically and with a given spacing distance from the first hollow cavity in a half of the housing facing towards the third resistor.

6. The broadband directional coupler according to claim 5, wherein a mean diameter of the annular core is smaller than a mean diameter of the annular third resistor.

7. The broadband directional coupler according to claim 1, wherein the first side of the ceramic plate is connected in a conductive manner outside the annular third resistor to a second side of the ceramic plate via several through-contacts arranged in a circle with a given angular grid.

8. The broadband directional coupler according to claim 1, wherein the conductive layer of the ceramic plate disposed within the annular third resistor is connected to a second connection of the second resistor via a wire which is guided in a recess of the housing free from electromagnetic fields.

9. The broadband directional coupler according to claim 1, wherein an internal outer-conductor impedance of the housing of the broadband directional coupler is larger than an impedance of the third resistor.

10. The broadband directional coupler according to claim 1, wherein the first resistor is a resistor layer printed on a ceramic substrate.

11. The broadband directional coupler according to claim 10, wherein the first resistor is arranged in a third hollow cavity free from electromagnetic fields in a housing of the broadband directional coupler arranged with substantial rotational symmetry around the inner conductor.

12. The broadband directional coupler according to claim 10, wherein the first resistor is supported outside the first connection of the first resistor and a second connection of the first resistor in each case on a large-area counter bearing of a third hollow cavity made of aluminium in order to remove thermal energy generated in the first resistor.

13. The broadband directional coupler according to claim 10, wherein the first resistor is hollow below and above the resistor layer.

14. The broadband directional coupler according to claim 1, wherein a third hollow cavity includes a slot to the first hollow cavity, which provides a spatial extension of a galvanic connection between the inner conductor and the first resistor.

15. The broadband directional coupler according to claim 2, wherein the measuring unit is arranged in a fourth hollow cavity free from electromagnetic fields in a housing of the broadband directional coupler or in an additional housing directly connected to the housing of the broadband directional coupler and shielding electromagnetic fields.

16. The broadband directional coupler according to claim 1, wherein a measuring unit for measuring a power of a forward high-frequency signal is galvanically separated from a measuring unit for measuring a returning high-frequency signal.

17. The broadband directional coupler according to claim 1, wherein, for electromagnetic shielding, springs are inserted in a circular groove on end surfaces of the halves of the housing of the broadband directional coupler, of which the diameter is slightly smaller than an external diameter of the housing.

18. The broadband directional coupler according to claim 4, wherein the electrically conductive material is aluminum.

19. The broadband directional coupler according to claim 11, wherein the third hollow cavity includes a slot to the first hollow cavity, which provides a spatial extension of a galvanic connection between the inner conductor and the first resistor.

* * * * *